(12) United States Patent
Herner (10) Patent No.: US 8,513,636 B2
(45) Date of Patent: Aug. 20, 2013

(54) VERTICAL DIODES FOR NON-VOLATILE MEMORY DEVICE

(71) Applicant: Crossbar, Inc., Santa Clara, CA (US)

(72) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/748,490

(22) Filed: Jan. 23, 2013

(65) Prior Publication Data

US 2013/0134419 A1    May 30, 2013

Related U.S. Application Data

(62) Division of application No. 13/149,807, filed on Mar. 31, 2011, now Pat. No. 8,394,670.

(51) Int. Cl.
*H04L 29/02* (2006.01)
*H01L 45/00* (2006.01)

(52) U.S. Cl.
USPC ........... 257/2; 257/3; 257/4; 257/5; 257/89; 257/295; 257/296; 257/E21.003; 257/E21.004; 257/E29.002; 365/148; 438/22; 438/95; 438/102; 438/104

(58) Field of Classification Search
USPC ........... 257/2, 3, 4, 5, 89, 295, 296, E21.003, 257/E21.004, E29.002; 438/22, 95, 102, 438/104; 365/148
See application file for complete search history.

(56) References Cited

U.S. PATENT DOCUMENTS

| 7,426,128 B2 | 9/2008 | Scheuerlein |
| 7,824,956 B2 * | 11/2010 | Schricker et al. ............ 438/104 |
| 7,875,871 B2 * | 1/2011 | Kumar et al. .................... 257/2 |
| 8,227,787 B2 * | 7/2012 | Kumar et al. .................... 257/2 |
| 8,233,308 B2 * | 7/2012 | Schricker et al. ............ 365/148 |
| 8,237,146 B2 | 8/2012 | Kreupl et al. |
| 8,394,670 B2 * | 3/2013 | Herner ........................ 438/104 |
| 2009/0001345 A1 | 1/2009 | Schricker et al. |
| 2009/0168486 A1 | 7/2009 | Kumar |
| 2009/0257265 A1 | 10/2009 | Chen et al. |
| 2010/0157651 A1 | 6/2010 | Kumar et al. |

FOREIGN PATENT DOCUMENTS

WO    WO 2009/005699 A1    1/2009

OTHER PUBLICATIONS

Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.

* cited by examiner

*Primary Examiner* — Dao H Nguyen
(74) *Attorney, Agent, or Firm* — Ogawa P.C.

(57) ABSTRACT

A steering device. The steering device includes an n-type impurity region comprising a zinc oxide material and a p-type impurity region comprising a silicon germanium material. A pn junction region formed from the zinc oxide material and the silicon germanium material. The steering device is a serially coupled to a resistive switching device to provide rectification for the resistive switching device to form a non-volatile memory device.

10 Claims, 6 Drawing Sheets

VERTICAL DIODES FOR NON-VOLATILE MEMORY DEVICE

CROSS REFERENCE TO RELATED APPLICATIONS

The present invention is a divisional application of non-provision U.S. patent application Ser. No. 13/149,807, filed Mar. 31, 2011, which is related-to and incorporates by reference, for all purposes, U.S. patent application Ser. No. 11/875,541, filed Oct. 19, 2007.

BACKGROUND

The present invention is generally related to steering elements for switching devices. More particularly, embodiments according to the present invention provide a method and a device structure to form a rectifying element that can be fabricated at low temperatures (<approximately 450 C) and compatible with CMOS processing. Embodiments according to the present invention can be applied to non-volatile memory devices but it should be recognized that the present invention can have a much broader range of applicability.

The success of semiconductor devices has been driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Additionally, switching a PCRAM device requires a large amount of power, and organic RAM or ORAM fabrication techniques are incompatible with large volume silicon-based fabrication and device reliability is usually poor.

From the above, a new semiconductor device structure and integration is desirable.

BRIEF SUMARY OF THE PRESENT INVENTION

The present invention is generally related to steering elements for switching devices. More particularly, embodiments according to the present invention provide a manufacturing method, a device structure to form a rectifying element at low fabrication temperatures that can then be coupled with a switching element, for example, a resistive switching element, to form a memory cell, a device including processing capability and a memory cell having such a rectifying element, or the like. Embodiments according to the present invention can be applied to non-volatile memory devices, processing devices, or the like, but it should be recognized that the present invention can have a much broader range of applicability.

In a specific embodiment, a steering device structure is provided. The steering device is vertically integrated with a two terminal device and can be fabricated at a temperature less than approximately 450 Degree Celsius. The steering device includes an n-type impurity region and a p-type impurity region. The n-type impurity region includes a zinc oxide material in a specific embodiment. The p-type impurity region includes a p-type silicon germanium material in a specific embodiment. The zinc oxide material and the p-type silicon germanium material form a p-n junction region for the steering device.

In a specific embodiment, a vertical diode coupled with a switching device is provided comprising a memory cell. The non-volatile memory device structure includes a switching device. The resistive switching device includes a first wiring structure, a second wiring structure comprising, and a resistive switching element comprising an amorphous silicon material sandwiched between the first wiring structure and the second wiring structure. In a specific embodiment, the second wiring structure includes an active metal material in physical and electrical contact with the resistive switching material in a specific embodiment. The non-volatile memory device includes a diode device serially coupled to the resistive switching device and disposed between the first wiring structure and the resistive switching element. The diode device includes a zinc oxide material having an n⁻ type impurity characteristic and a silicon germanium material having a p+ type impurity characteristic. The non-volatile memory device includes an n⁻p+ junction formed from the zinc oxide material having the n type impurity characteristic and the silicon germanium material having a p+ type impurity characteristic in a specific embodiment.

In a specific embodiment, a method of forming a non-volatile memory device is provided. The method includes providing a substrate having a surface region and forming a first dielectric material overlying the surface region. The method includes forming a first wiring structure overlying the first dielectric material and depositing a metal oxide material having an n-type impurity characteristic overlying the first wiring structure. The metal oxide having the n-type impurity characteristic may be provided using a zinc oxide material in a specific embodiment. A silicon germanium material having a p+ type impurity characteristic is deposited overlying the metal oxide material having the n− type impurity characteristic. In a specific embodiment, a p+n− junction region is formed from the metal oxide material having the n− type impurity characteristic and the silicon germanium material having the p+ type impurity characteristic. The method includes depositing a resistive switching material comprising an amorphous silicon material overlying the silicon germanium material having the p+ type impurity characteristic. In a specific embodiment, the method includes forming a second wiring structure overlying the resistive switching material. The second wiring structure includes at least an active metal material in physical and electrical contact with the resistive switching material in a specific embodiment. In a specific embodiment, the diode device is configured to allow current to flow in a direction of forward bias for the resistive switching device using amorphous silicon as the switching material.

In other implementations, the diode device can be configured in a memory cell to allow current to flow in a reversed bias of a switching device. This allows flexibility for applications in a wide range of switching materials, e.g. phase change chalcogenides, ReRAM metal oxides, and others. These switching materials may use a high voltage and a low current, or a high current and a low voltage, or other combinations for switching. Depending on the embodiment, these switching devices may be switched with the diode in reverse bias or forward bias. Further, the diode device also allows vertical stacking of multiple layers of switching devices and share an interconnect without disturb. Further details are described in the application "Architecture for 3D Memory."

Many benefits can be achieved by ways of the present invention over conventional techniques. Embodiments according to the present invention provide a method and a device structure for a vertically integrated diode that can be fabricated at a temperature no greater than about 450 Degree Celsius. The diode device can be serially coupled with a resistive switching device allowing rectification for the non-volatile memory device in a specific embodiment. The diode device can be fabricated at process temperatures no greater than about 450 Degree Celsius such that the non-volatile memory device can be formed in a backend process of a CMOS device in a specific embodiment. The diode can be implemented depending upon at least a mechanism for switching of the switching element, such that current is allowed to flow in a forward bias or a reverse bias of the switching device. Additionally, the non-volatile memory device can be fabricated using convention semiconductor processing techniques without medication to the existing process equipment. Although a nonvolatile switching element using amorphous silicon material is described, any type of switching element, such as chalcogenide phase change or metal oxide resistance change can be coupled with the steering element. Depending on the embodiment, the steering device may be used in non memory applications, such as logic devices, light emitting diodes (LEDS), flat panel displays, and others. Again, depending upon the embodiment, one or more of these benefits may be achieved. One skilled in the art would recognize other modifications, variations, and alternatives.

DETAILED DESCRIPTION OF THE PRESENT INVENTION

The present invention is generally related to steering elements. More particularly, embodiments according to the present invention provide a method and a device structure to form a rectifying element vertically integrated with a resistive switching device. The steering device can be fabricated at a process temperature less than about 450 Degrees Celsius. Embodiments according to the present invention can be applied to non-volatile memory devices, but it should be recognized that the present invention can have a much broader range of applicability.

High density and low cost storage devices are in ever increasing demand due to the growth in consumer devices common in the market place. Current non-volatile memory devices including Flash are probably at an end to further scaling due to fundamental limitations in the devices. It is predicted that current charge storage in a floating gate or a dielectric material in Flash devices may not be possible in device size less that about 18 nm. A new category of devices using an interconnected crossbar configuration that can be vertically integrated in a three dimensional manner provides a high device density not achievable in current memory devices.

Leakage current from switching elements in an interconnected crossbar array can affect proper operations in a large array of switching elements (for example, read write, or erase) of the device. To reduce the leakage current and to attempt to isolate a cell, rectifying elements can be used. As the (resistive) switching devices are usually fabricated in a backend of a CMOS process, a thermal budget needs to be considered. Accordingly, process temperatures for the disclosed embodiments need to be optimized so as not to affect or degrade CMOS device performance or impair the possibility to use low temperature (and low resistivity) interconnects such as aluminum. Embodiments of the present invention provide a resistive switching device structure that includes at least a rectifying device and related methods that can be processed at temperatures lower than about 450 Degree Celsius, that are compatible with current CMOS process.

Figure 1:
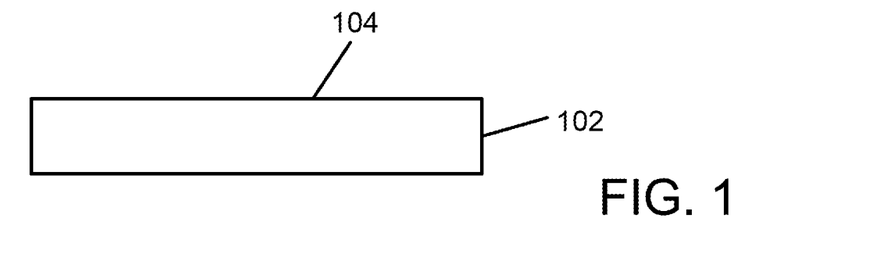
FIG. 1-14 are simplified diagrams illustrating a method of forming a non-volatile memory having rectification according to an embodiment of the present invention.

In a specific embodiment a method of forming a non-volatile memory device is provided as illustrated in FIG. 1-14. As shown in FIG. 1, a substrate 102 having a surface region 104 is provided. The substrate can be a semiconductor material in a specific embodiment. The substrate can include one or more transistor device (for example CMOS device) or others formed thereon. The one or more transistor devices provide controlling circuitry for the switching element or switching element plus steering element, provide computational or logical processing capability, or the like in a specific embodiment. The semiconductor material can be silicon material, including single crystal silicon material, a silicon germanium material, a silicon on insulator substrate, or others, depending on the application.

Figure 2:
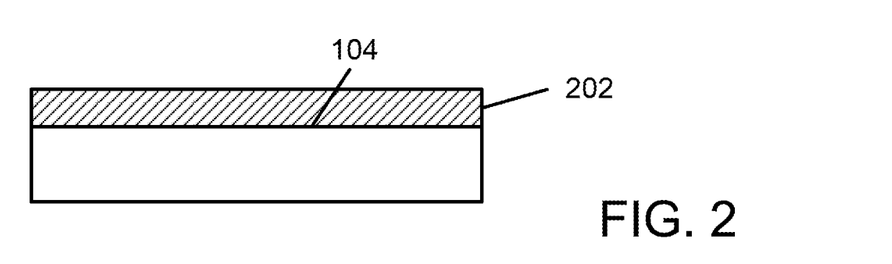

Referring to FIG. 2, a first dielectric material 202 is formed overlying the surface region 104 of the substrate. The first dielectric material can be silicon oxide, silicon nitride, a high K dielectric, or a low K dielectric or a combination including a multilayer dielectric stack depending on the embodiment.

Figure 3:
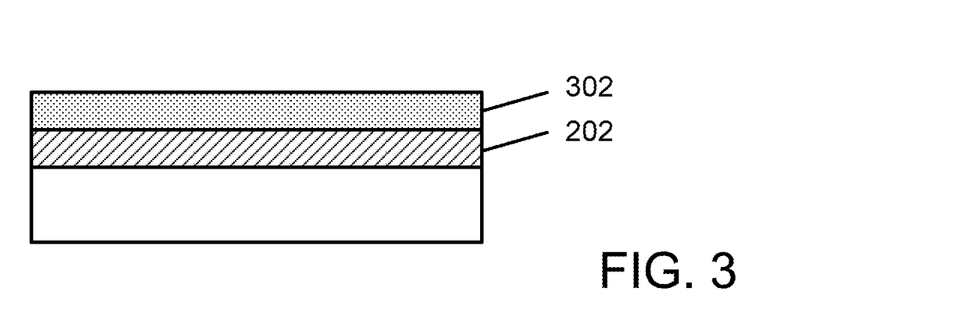

In various embodiments, illustrated in FIG. 3, the method deposits a first wiring material 302 overlying the first dielectric material 202. The first wiring material 302 can be a suitable metal material or a doped semiconductor material, depending on the application. For example, the first wiring material can be those commonly used in semiconductor transistor processing such as copper, tungsten, or aluminum, and others. In some embodiments, the first wiring material may include one or more adhesion layers or diffusion barrier layers allowing the first wiring material 302 to have a proper adhesion to the first dielectric material 202. The adhesion layer can include titanium, titanium nitride, tungsten nitride, tungsten, tantalum, tantalum nitride, and others.

Figure 4:
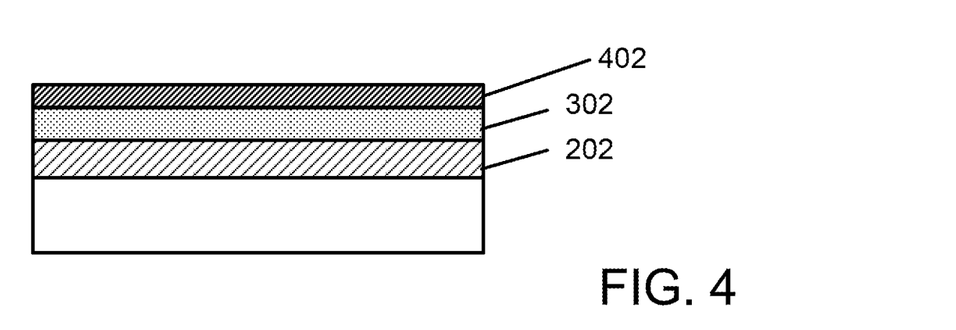

As illustrated in FIG. 4, in a specific embodiment, the method includes depositing a semiconductor metal oxide material 402 overlying the first wiring material 302. The semiconductor metal oxide material 402 can have an $n^-$ type impurity characteristic in a specific embodiment. The semiconductor metal oxide material 402 can be formed at a process temperature of less than about 450 Degree Celsius. Further, semiconductor metal oxide material 402 typically has a crystalline or polycrystalline characteristic. In a specific embodiment, the semiconductor metal oxide material 402 can be an intrinsic zinc oxide material that is not intentionally doped.

In various embodiments, the zinc oxide material can be deposited using a physical vapor deposition process such as radio frequency (RF) sputtering using a suitable zinc oxide target. Alternatively, the zinc oxide material 402 can be deposited using a reactive DC magnetron using a zinc target in a presence of oxygen. Deposition temperature can be at room temperature (for example, about 25 Degree Celsius) to about 200 Degree Celsius. The as deposited zinc oxide material 402 typically has an n⁻ type impurity characteristic in a specific embodiment.

Figure 5:
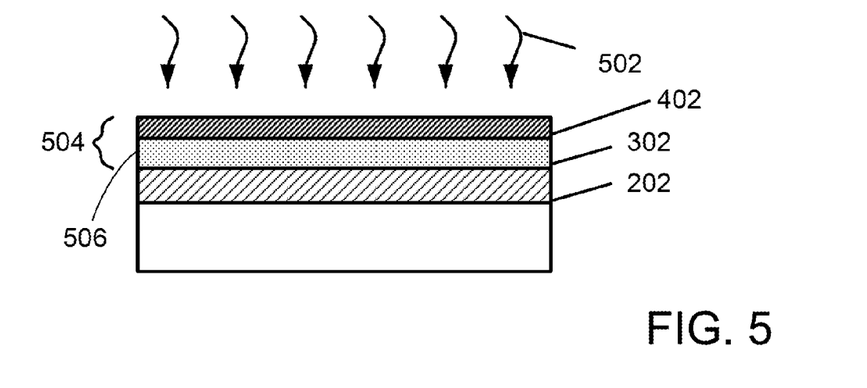
Figure 5A:
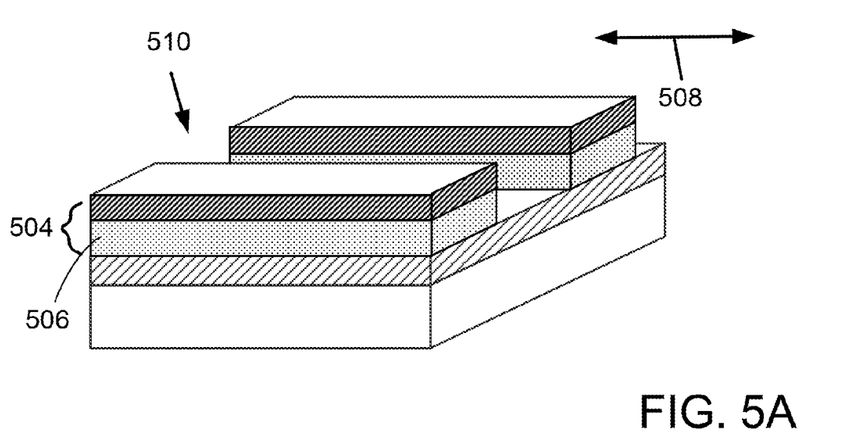

As illustrated in FIGS. 5 and 5A, in a specific embodiment, the method includes subjecting the first wiring material 302 and the zinc oxide material 402 to a first patterning and etching process 502 to form one or more first structures 504 as illustrated in FIG. 5 and FIG. 5A. The one or more first structures 504 typically include a first wiring structure 506 in a specific embodiment. As illustrated in FIG. 5A, the first structure 504 including the first wiring structure 506 is elongated in shape and configured to spatially extend in a first direction 508.

In other embodiments, the zinc oxide material 402 may be further doped using aluminum oxide to form an aluminum doped zinc oxide material, commonly known as AZO. A common reaction mixture is 2 wt % $Al_2O_3$ and 98 wt % ZnO to form an n+ zinc oxide material. Other suitable n-type dopants may be used. These other n-type dopants for ZnO can include $Ga_2O_3$, $B_2O_3$, $In_2O_3$, and others.

Figure 6:
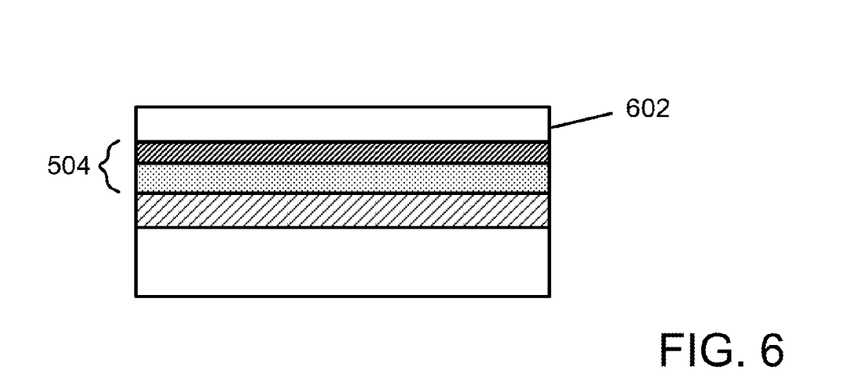
Figure 7:
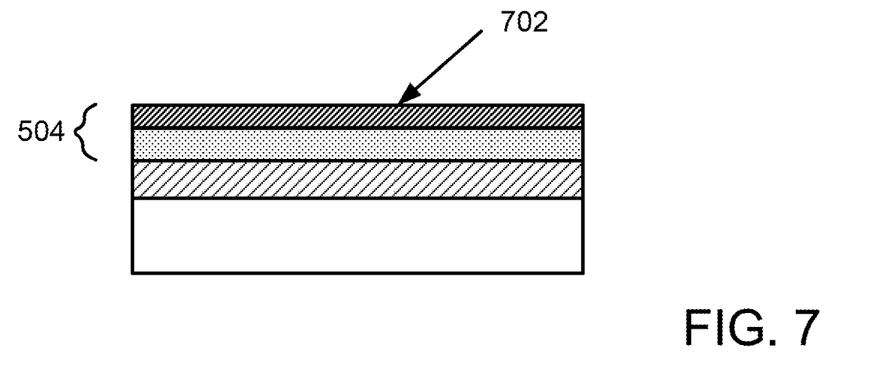

In FIG. 6, in a specific embodiment, the method includes depositing a second dielectric material 602 overlying the first structure 504. Next, as illustrated in FIG. 7, the second dielectric material 602 is subjected to a first planarizing process to expose a surface region 702 of the zinc oxide material. Second dielectric material 602 that fills channels 508 remain and isolate the first structure 504 including the first wiring structure 506 illustrated in FIG. 5A.

Figure 8:
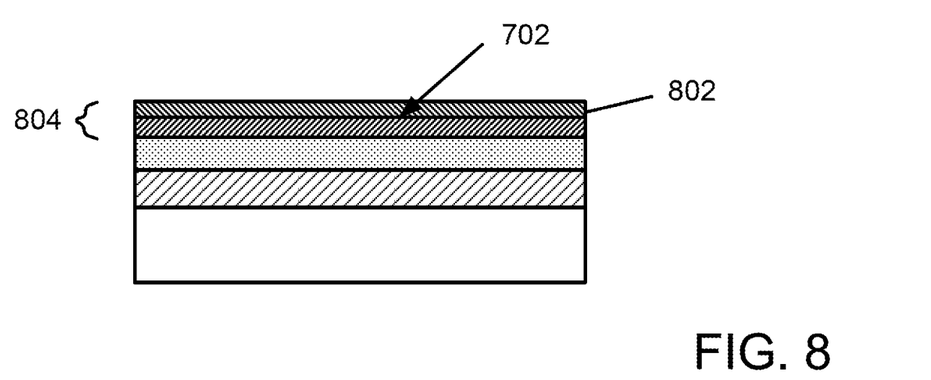

Turning to FIG. 8, in a specific embodiment, embodiments include depositing a silicon germanium material 802 overlying the surface region 702 of the semiconductor metal oxide material 402, for example, zinc oxide material and a surface region of the second dielectric material 602 (within channels 510). In various embodiments, the silicon germanium material 802 may be doped to have a p+ impurity characteristic.

In various embodiments, the silicon germanium material 802 having the p+ type impurity characteristic can be deposited using a chemical vapor deposition (CVD) process, including plasma enhanced CVD, low pressure CVD, and others. In some examples, deposition temperature can range from about 350 Degree Celsius to about 430 Degree Celsius and preferably no higher than 450 Degree Celsius. In a specific embodiment, the p+ silicon germanium material is deposited using disilane ($Si_2H_6$) as a silicon precursor, germane ($GeH_4$) as a germanium precursor, and the p+ impurity as a boron species. The boron species can be provided using diborane, boron chloride, or the like, depending on the embodiment. The deposited p+ silicon germanium material 802 is typically crystalline without further anneal.

In various embodiments, the n-type zinc oxide material 402 (doped or undoped) and the p+ silicon germanium material 802 form a p+n⁻ junction for a diode device 804 or a steering device in a specific embodiment. The diode device 804 can be vertically integrated and serially connected to a switching device to improve rectification for the switching device, described below, in a specific embodiment.

Figure 9:
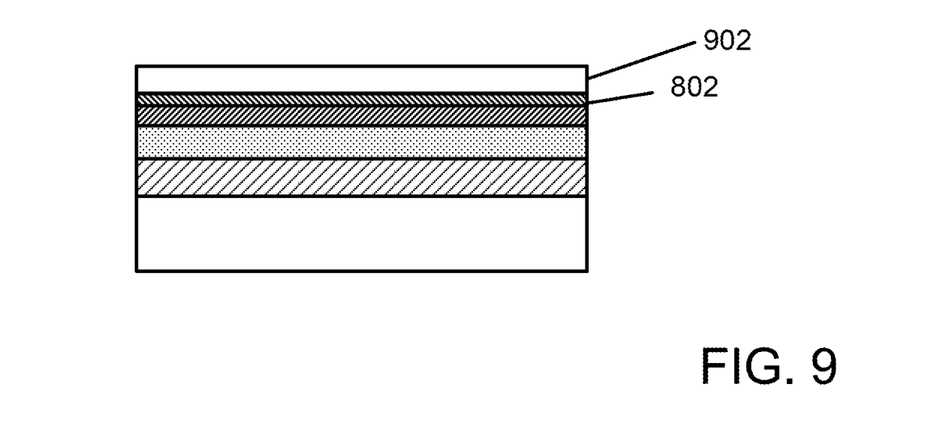

Various embodiments of the method may include depositing a resistive switching material 902 overlying the p+ silicon germanium material 802 as shown in FIG. 9. The resistive switching material 902 is characterized by a state, for example, a resistance state dependent on an electric field in the resistive switching material. In a specific embodiment, the resistive switching material 902 is an amorphous silicon material. The amorphous silicon material is essentially intrinsic and not intentionally doped in a specific embodiment. In a specific embodiment, the amorphous silicon material can be deposited using a low pressure chemical vapor deposition process or a plasma enhanced chemical vapor deposition process using silane or disilane as silicon precursor in a specific embodiment. The silicon precursor may be a suitable chlorosilane in a reducing environment (for example hydrogen) depending on the embodiment. Alternatively, the amorphous silicon material may be deposited using a physical vapor deposition process using a silicon target. Deposition temperature can range from about 250 to about 400 Degree Celsius, depending on the application.

Figure 10:
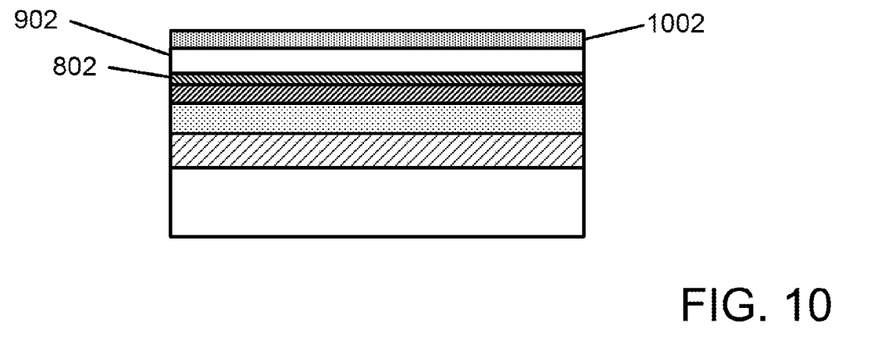

Next, as illustrated in FIG. 10, in a specific embodiment, a metal material 1002 is formed overlying the resistive switching material 902. For amorphous silicon as the resistive switching material 902, the metal material 1002 can be silver, gold, platinum, palladium, aluminum, nickel, and others. The metal material 1002 has a suitable diffusion characteristic in the amorphous silicon material upon application of a voltage or in a presence of a suitable electric field in a specific embodiment. In a specific embodiment, the metal material is silver.

Depending on the embodiment, a diffusion barrier material or an adhesion layer material may be formed overlying the metal material 1002. The adhesion layer material would help prevent the metal material 1002 from diffusing to other parts of the device. Additionally, in a specific embodiment, the diffusion barrier layer material can be titanium nitride, titanium, tungsten nitride, tantalum, tantalum nitride, and others.

Figure 11:
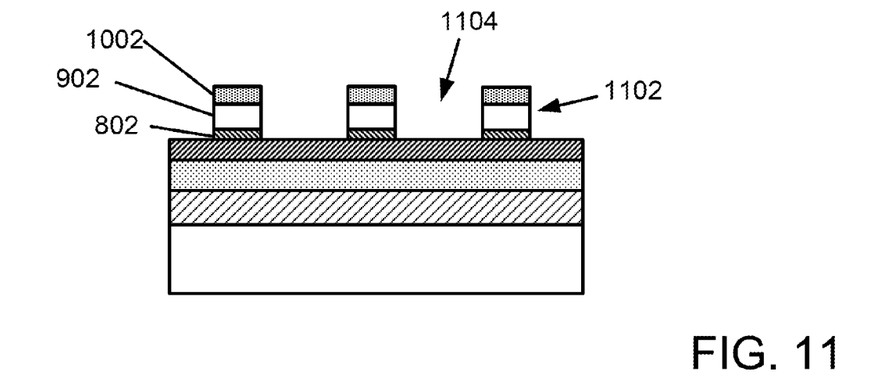
Figure 15:
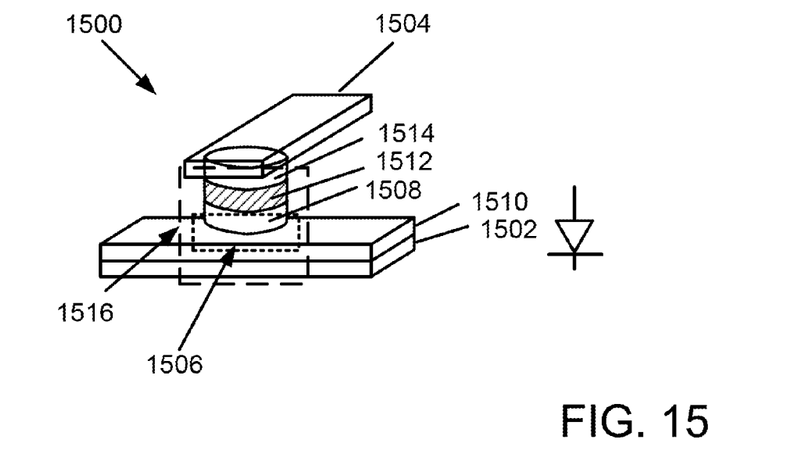
FIG. 15 is a simplified diagram illustrating a device structure of the non-volatile memory device according to an embodiment of the present invention.

Next, as illustrated in FIG. 11, the method subjects a stack of material comprising the diffusion barrier material, the metal material 1002, the amorphous silicon material 902, and the p+ silicon germanium material 802 to a patterning and etching process. As illustrated, one or more pillar structures 1102 may be formed, separated by gap regions 1104. The patterning and etching process may use the diffusion barrier material as a hard mask in a specific embodiment. In various embodiments, the pillar structures 1102 may be square, circular, ovoid, polygonal, rectangular, or the like. An example of this is illustrated in FIG. 15.

Figure 12:
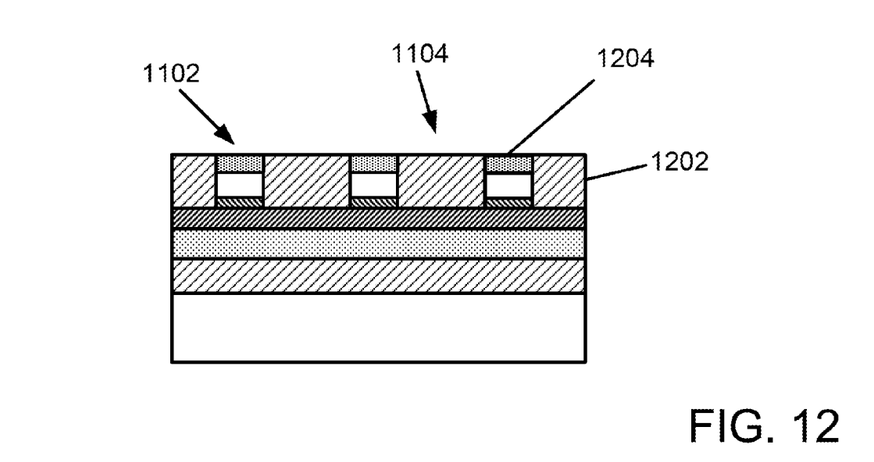

Referring to FIG. 12, the method includes forming a second dielectric material 1202 overlying the one or more pillar structures 1102 and filling the gap regions 1104. The method further subjects the second dielectric material 1202 to a planarizing process to expose a top surface region 1204 of each of the one or more pillar structures 1102 while maintaining the second dielectric material 1202 within the gap regions 1104, in a specific embodiment.

Figure 13:
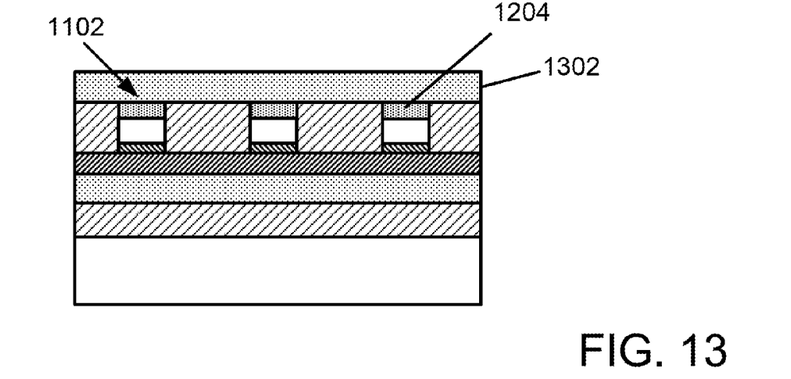

As illustrated in FIG. 13, embodiments of the method forms a second wiring material 1302 overlying the planarized second dielectric material 1202 and the exposed top surface region 1204 of the pillar structure 1102. The second wiring material 1302 can be a suitable metal material such as those commonly used for interconnects in CMOS processing. As merely an example, the second wiring material can be tungsten, aluminum, or copper, and the likes. The second wiring material 1302 can also be a suitably doped semiconductor, metal, or the like, depending on the application.

Figure 14:
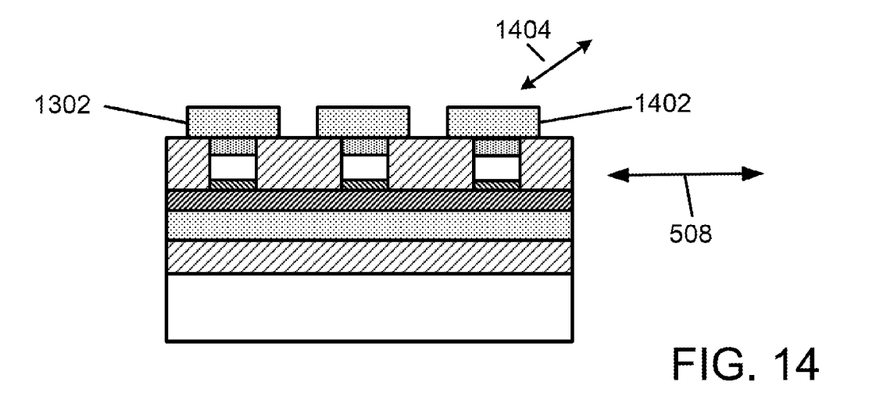

In FIG. 14, in a specific embodiment, the second wiring material 1302 is subjected to a third patterning and etching process to form a second wiring structure 1402 for the state change device. The second wiring structure 1402 is elongated in shape and configured to extend in a second direction 1404 at an angle to the first direction 508 of the first wiring structure 506. In various embodiments, first direction 508 and second direction 1404 may be orthogonal, angled, skew, or the like. In a specific embodiment, the pillar structure 1102 is a resistive switching element disposed in an intersection region formed from a second wiring structure 1402 and the first wiring structure 506, as shown.

In a specific embodiment, the first wiring structure 506, the second wiring structure 1402 and the resistive switching material 902 forms a resistive switching device for a non-volatile memory device. The p+ silicon germanium material 802 and the n– zinc oxide material 402 form a diode 804 serially coupled to the resistive switching device providing rectification for the non-volatile memory device in a specific embodiment.

As shown in the simplified diagram in FIG. 15, a perspective view of a resistive switching device 1500 is provided. The device 1500 includes a first wiring structure 1502 and a second wiring structure 1504. As shown, the first wiring structure 1502 and the second wiring structure 1504 are each elongated in shape. The first wiring structure 1502 is spatial arranged at an angle and preferably orthogonal to the second wiring structure 1504 in a specific embodiment. The device 1500 includes a diode device 1506 formed from a first semiconductor material 1508 having a p+ type impurity characteristic and a second semiconductor material 1510 having an n⁻ type impurity characteristic. In a specific embodiment, the first semiconductor material 1508 is a p+ type silicon germanium material and the second semiconductor material 1510 is a semiconductor metal oxide material. In various embodiments, the semiconductor metal oxide material is a zinc oxide material.

In various embodiments, the device 1500 includes a resistive switching element 1512 disposed in an intersecting region of the first wiring structure 1502 and the second wiring structure 1504. The resistive switching element 1512 comprises an amorphous silicon material that is not intentionally doped, in a specific embodiment. In a specific embodiment the device 1500 includes an active metal material 1514 in physical and electrical contact with the resistive switching element 1512 in a specific embodiment. The active metal material 1514 can be a silver material or other suitable metal materials, although other metals may also be used depending on the specific embodiment. These other metal material can include gold, platinum, palladium, platinum, copper, nickel, aluminum, including any combinations of theses, and alloy formed thereof. The active metal material 1514 can be a portion of the second wiring structure 1504 in a specific embodiment. The second wiring structure 1504 including the active metal material 1514, the resistive switching element 1512, and the first wiring stricture 1502 form a resistive switching device 1516 in a specific embodiment. As shown, the diode device 1506 is serially coupled to the resistive switching device 1516 to provide rectification for the resistive switching device 1516. In a specific embodiment such rectification prevents leakage current to interfere with proper operations (Read, Write, or Erase) of the resistive switching device 1516 in an interconnected crossbar array in a specific embodiment.

Referring again to FIG. 15. The active metal material 1514 forms a metal region in a portion of the resistive switching material 1512 to cause a change in a resistance state of the resistive switching material 1512 depending upon application of an operating voltage. For example, the operating voltage can be a write voltage, having a positive bias applied to the second electrode in a specific embodiment. The operating voltage can be an erase voltage after write, having a negative bias applied to the second electrode, in a specific embodiment. Of course, one skilled in the art would recognize other variations, modifications, and alternatives.

Figure 16:
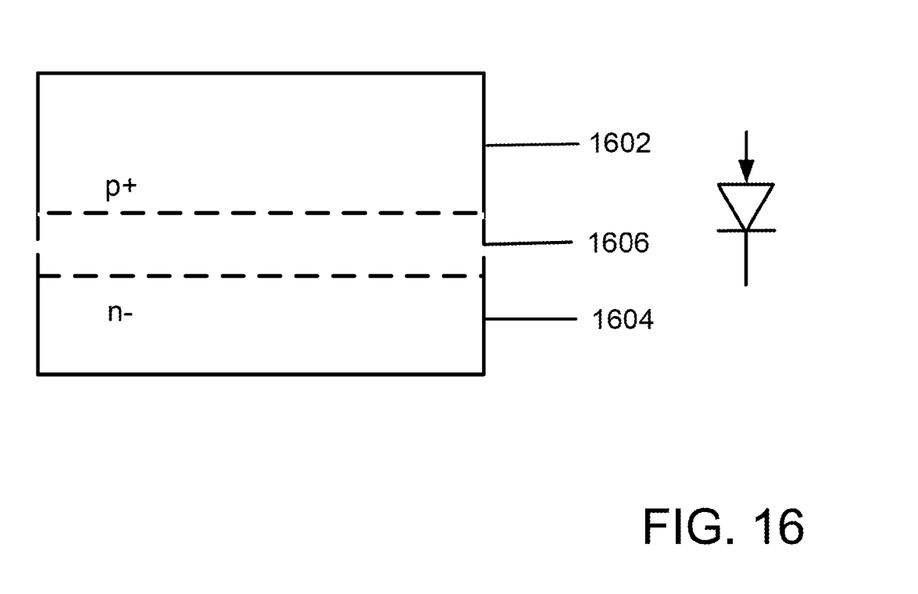
FIG. 16 is a simplified diagram illustrating a steering device according to an embodiment of the present invention.

In a specific embodiment, illustrated in FIG. 16, a steering device structure is provided. The steering device structure includes a p-impurity region 1602, an n-impurity region 1604 and a pn junction region 1606 formed from the p-impurity region 1602 and the n impurity region 1604. The n type impurity region 1604 is provided using a metal oxide material having an n-type characteristic. In a specific embodiment, the metal oxide material includes a zinc oxide material. The zinc oxide material is intentionally undoped and has an n⁻ type impurity characteristic. In other embodiment, the zinc oxide material can be further doped using impurities such as aluminum oxide, gallium oxide, indium oxide, and the likes to form an n type or n⁺ type impurity characteristic. Deposition temperature can range from about room temperature (for example, 25 Degree Celsius) to less than about 100 Degree Celsius. The as formed zinc oxide material (doped or undoped) has a polycrystalline characteristic in a specific embodiment. The p-impurity region 1602 can be formed from a p-type silicon germanium material. The p-type silicon germanium material may be formed polycrystalline at a temperature of less than or equal to about 450 Degree Celsius. These deposition temperatures are intended to be compatible with front end CMOS processes. In a specific embodiment, the p-type silicon germanium material can be doped using a suitable impurity species, for example, a boron species, to have a p+ impurity type characteristic. In a specific embodiment, the steering device can be serially coupled to a two terminal device to provide rectification in a specific embodiment. Depending on the embodiment, the steering device can be connected in a forward bias or reversed bias to the two terminal device. The two terminal device can be a resistive switching device such as ReRAM, PCRAM, and others.

Though the present application has been exemplified in various embodiment, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A device fabricated at a temperature no higher than 450 Degree Celsius, comprising:
   a steering device comprising:
      an n-type impurity region, the n-type impurity region comprising an n-type zinc oxide material; and
      a p-type impurity region, the p-type impurity region comprising a p-type silicon germanium material, wherein a pn junction region is formed from the n-type metal oxide material and the p-type silicon germanium material; and
   a two terminal device vertically disposed on top of the steering device, wherein one terminal is coupled to the steering device, and a second terminal is coupled to a first electrode.

2. The device of claim 1 wherein the n-type zinc oxide material is formed at a first temperature ranging from about 25 Degree Celsius to less than about 100 Degree Celsius.

3. The device of claim 2 wherein the n-type zinc oxide material is not intentionally doped and has an n⁻ type impurity characteristic.

4. The device of claim 2 wherein the n-type zinc oxide material has a polycrystalline characteristic.

5. The of claim 1 wherein the n-type zinc oxide material comprises an impurity species selected from a group consisting of: aluminum, gallium, indium, and boron.

6. The device of claim 1 wherein the p-type silicon germanium material is formed at a second temperature ranging from about 350 Degree Celsius to about 450 Degree Celsius.

7. The device of claim 1 wherein the p-type silicon germanium material comprises a p type impurity species in a spatial region of a silicon germanium material, wherein the p type impurity species is selected from a group consisting of: boron species, a gallium species, an aluminum species, an indium species.

8. The device of claim 1 wherein the p-type silicon germanium material has a polycrystalline characteristic.

9. The device of claim 1 wherein the two terminal device comprises a resistive switching device.

10. The device of claim 1 wherein the steering device is coupled to device second electrode.

* * * * *

UNITED STATES PATENT AND TRADEMARK OFFICE
CERTIFICATE OF CORRECTION

| | | |
|---|---|---|
| PATENT NO. | : 8,513,636 B2 | |
| APPLICATION NO. | : 13/748490 | |
| DATED | : August 20, 2013 | |
| INVENTOR(S) | : Herner | |

It is certified that error appears in the above-identified patent and that said Letters Patent is hereby corrected as shown below:

On the title page item [62], change U.S. patent application Ser. No. 13/149,807, filed Mar. 31, 2011 to -- U.S. patent application Ser. No. 13/149,807, filed May 31, 2011 --

In the specification

Column 1 line 8-9, change U.S. patent application Ser. No. 13/149,807, filed Mar. 31, 2011 to -- U.S. patent application Ser. No. 13/149,807, filed May 31, 2011 --

Signed and Sealed this
Twelfth Day of January, 2016

Michelle K. Lee
*Director of the United States Patent and Trademark Office*